United States Patent [19]

Berman

[11] Patent Number: 5,056,552
[45] Date of Patent: Oct. 15, 1991

[54] HIGH TEMPERATURE RECIRCULATING CHEMICAL BATH CONSTRUCTION

[75] Inventor: Allan Berman, Sunnyvale, Calif.

[73] Assignee: Imtec Products, Inc., Sunnyvale, Calif.

[21] Appl. No.: 650,193

[22] Filed: Feb. 4, 1991

[51] Int. Cl.$^5$ ............................................. F16K 49/00
[52] U.S. Cl. .................................... 137/334; 137/563; 137/565; 137/574; 220/4.12; 220/643
[58] Field of Search ....................... 220/506, 4.12, 408, 220/469, 643; 137/563, 565, 574, 341, 334

[56] References Cited

U.S. PATENT DOCUMENTS

| | | | |
|---|---|---|---|
| 2,582,801 | 1/1952 | Steen | 220/408 |
| 3,987,816 | 10/1976 | Lange | 137/563 |
| 4,804,990 | 2/1989 | Jessop | 137/565 |
| 4,880,138 | 11/1989 | Pfeiffer et al. | 220/463 |
| 4,934,553 | 6/1990 | McCarthy | 220/469 |

*Primary Examiner*—A. Michael Chambers
*Attorney, Agent, or Firm*—Harris Zimmerman

[57] ABSTRACT

A chemical bath for immersing articles such as integrated circuit wafers in a hot flow of etchant or other liquid includes a liquid receptacle with a first compartment for receiving the articles and a second compartment which acts as sump and further includes a trough which channels overflow from the first compartment into the sump. A pump recirculates liquid from the sump back to the first compartment. The receptacle is supported by a casing in which the lower region of the receptacle is situated. The casing in which the lower region of the receptacle is situated. The casing is sealed by a flange on the receptacle which overlays a rim member on the casing and by sealing material situated between the rim member and the underside of the flange. The flange is located below the trough in vertically spaced apart relationship with the trough. This inhibits direct heat transfer from the trough to the seal and thereby enhances seal durability.

10 Claims, 3 Drawing Sheets

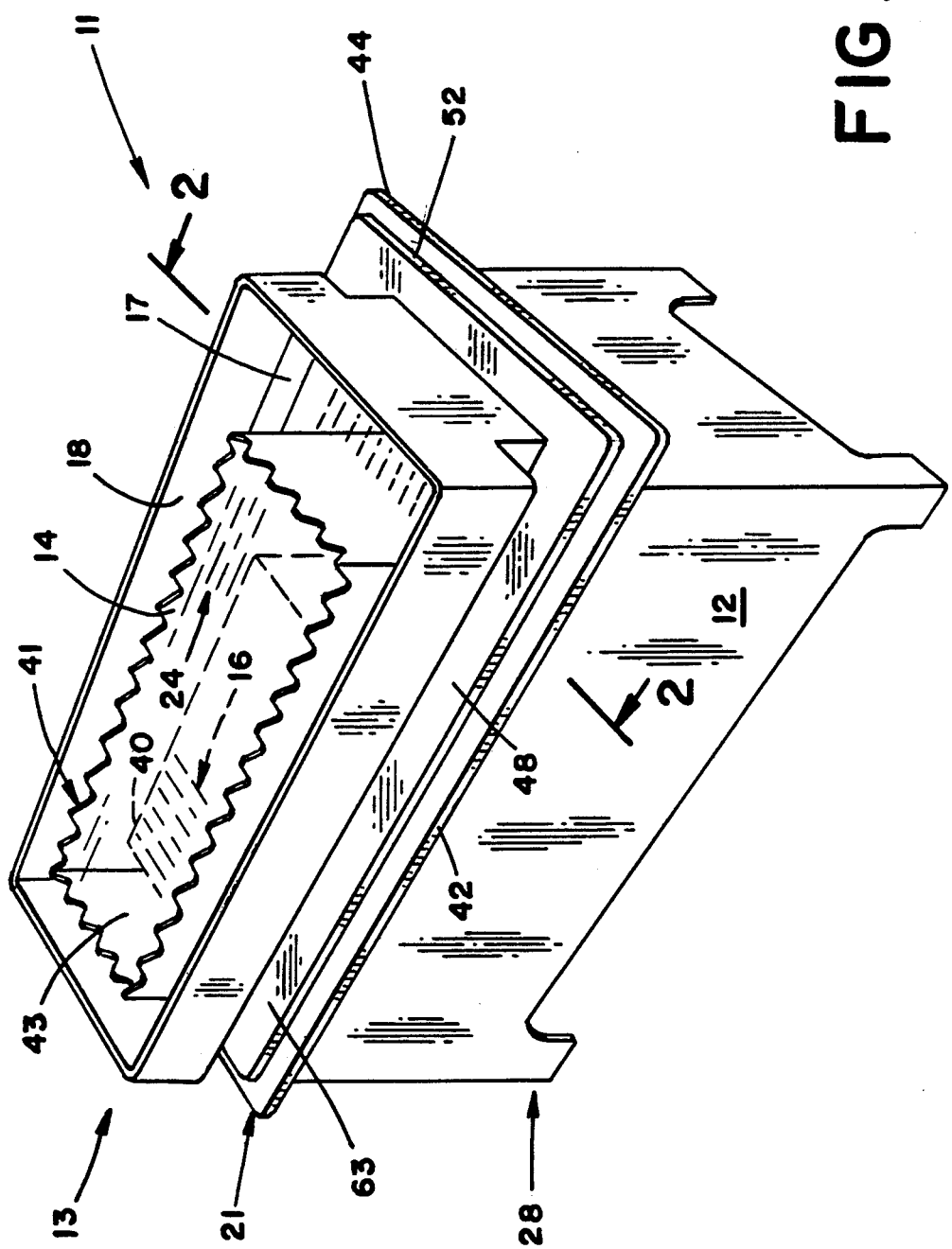

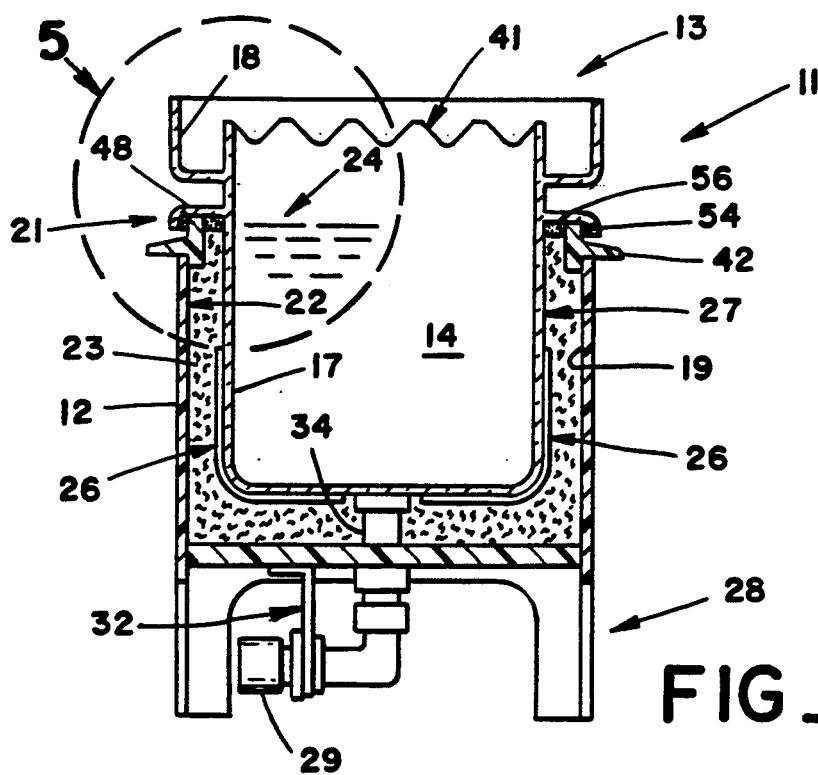
FIG_2
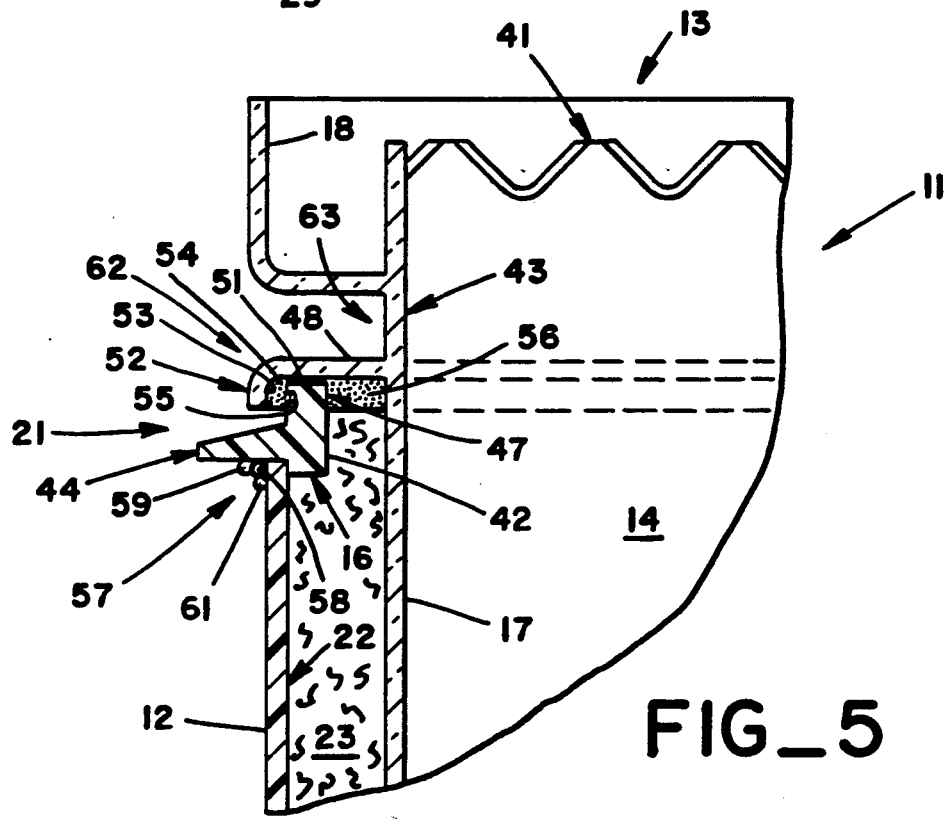
FIG_5

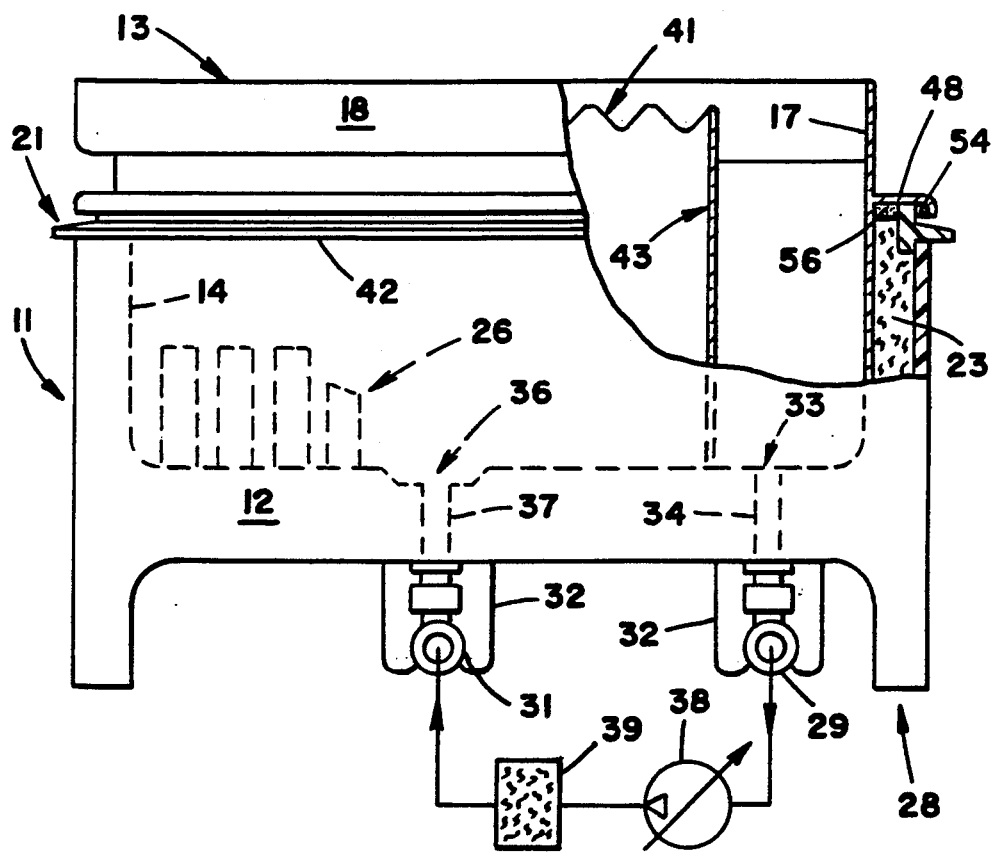
FIG_3
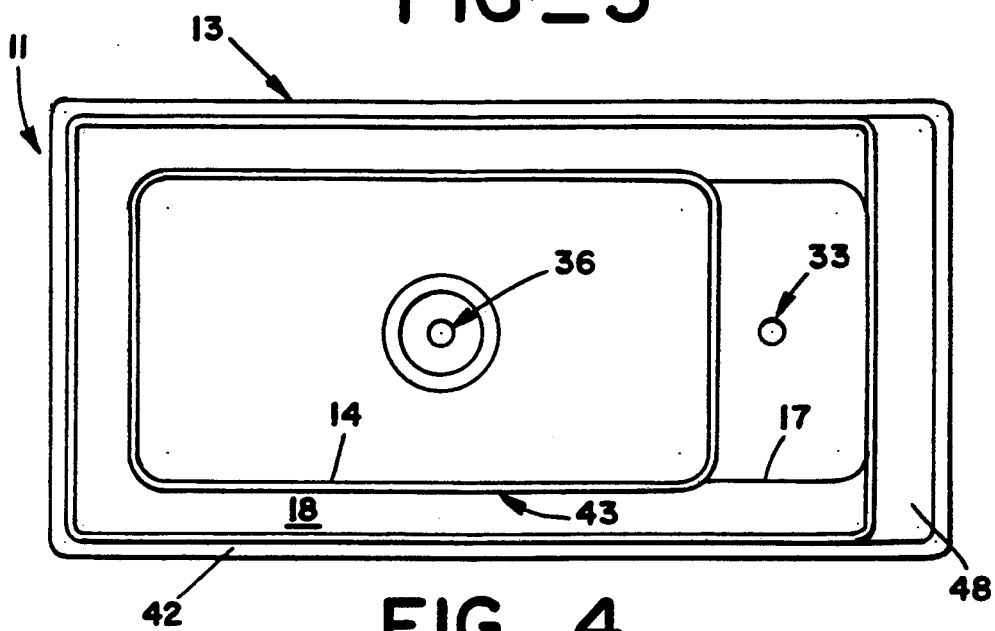
FIG_4

HIGH TEMPERATURE RECIRCULATING CHEMICAL BATH CONSTRUCTION

TECHNICAL FIELD

This invention relates to chemical baths for immersing articles in liquid chemicals during manufacturing operations and more particularly to the sealing of the casing or housing of chemical baths of the type in which articles are exposed to a recirculating flow of hot liquid.

BACKGROUND OF THE INVENTION

Various industrial operations require immersion of a product in hot liquids. In the electronics industry, for example, chemical baths are used for such purposes as etching and cleaning integrated circuit wafers. The liquid chemical must often be heated to a very high temperature and in many cases is highly corrosive. Thus certain components of the chemical bath must be formed of refractor materials which are also non-reactive to the liquid chemical.

A particularly advantageous form of chemical bath for such purposes is described in my copending U.S. patent application Ser. No. 07/434,709, filed Nov. 13, 1989 now U.S. Pat. No. 5,014,737 issued May 14, 1991 and entitled "Quartz Integrated Trough/Sump Recirculating Filtered High-Purity Chemical Bath, the specification and drawings of which are hereby incorporated by reference. A chemical bath of that form includes a liquid chemical receptacle with a first compartment which functions as a processing vessel for receiving the articles to be treated and a second compartment which forms a sump. A trough extends along the upper region of the receptacle to carry overflow from the processing vessel to the sump and a pump recirculates a filtered flow of the liquid from the sump back to the processing vessel. The receptacle, including the processing compartment, sump and trough, is preferably a unitized single component formed of a refractory material such as quartz. The lower region of the receptacle is situated within a casing or housing formed of a less brittle material that can be more easily fabricated into the desired shape, any of various plastics being suitable for the purpose.

The junction between the receptacle and the rim of the casing should be sealed to prevent entry of liquids, corrosive vapor or other fluids. In the prior construction this is provided for by situating the underside of the trough immediately above the rim of the casing and adhering a quantity of sealing mastic to the trough and casing rim.

Such a seal bonds three different materials together, the quartz or the like, the casing plastic and the mastic itself, each of which undergoes a different degree of thermal expansion in response to heating. This creates stresses that limit the life of the seal. Repeated thermal cycling tends to break the bond between the sealing mastic and the other materials and to disintegrate the mastic itself, thereby necessitating frequent replacement. The construction also limits the maximum liquid temperature in the chemical bath as extreme differential expansion of the seal components can break the relatively brittle quartz or the like.

A chemical bath construction in which the seal is more durable in the presence of high liquid temperatures and which tolerates higher liquid temperatures would be highly advantageous.

The present invention is directed to overcoming one or more of the problems discussed above.

SUMMARY OF THE INVENTION

In one aspect of the present invention, a recirculating chemical bath for immersing articles in a flow of hot liquid chemical includes a casing having a chamber and a receptacle having a lower region situated within the chamber of the casing and an upper region that extends above the casing. The receptacle has a first compartment forming a processing vessel for receiving the articles which are to be treated, a second compartment forming a sump for containing overflow from the processing vessel and a trough which extends along the processing vessel in position to receive the overflow and to carry the overflow to the sump. The trough is situated at a location on the receptacle that is above the casing rim and vertically spaced from the rim. The receptacle has an outwardly extending flange overlying the casing rim, the flange being below the trough and being vertically spaced from the trough. Sealing material is disposed at the underside of the flange in contact with both the flange and the casing rim. The bath further includes means for heating the liquid chemical and means for recirculating liquid chemical from the sump back to the processing vessel.

In another aspect, the present invention provides a recirculating chemical bath having a casing with a chamber and a rim member which extends around the perimeter of the chamber at the upper end of the casing. A liquid chemical receptacle has a processing vessel region for receiving the liquid chemical and the articles that are to be treated, a sump region for receiving liquid chemical that overflows from the processing vessel region, a trough extending along one end and opposite sides of the processing vessel region and along opposite sides of the sump region in position to carry the overflow into the sump region, the trough being above the casing rim member and being vertically spaced from the member. A flange on the receptacle extends around the processing vessel region and the sump region and extends outwardly over the casing rim member, the flange being at a location that is below the trough and vertically spaced apart from the trough. The receptacle including the trough and the flange are a unitized body of refractory material. Sealing material extends between the underside of flange and the casing rim member and is bonded to each. The chemical bath further includes means for heating the liquid chemical within the processing region and pumping and filtering means for recirculating a flow of filtered liquid chemical from the sump region back to the processing region.

The invention provides a recirculating chemical bath configuration of the hereinbefore described general type in which the juncture between differing materials at the seal between the casing and the hot liquid chemical receptacle experiences less stress from thermal cycling. Components of the seal are situated away from the hot chemical flow in the overflow trough and do not receive heat by direct transfer through the floor of the trough. This makes the seal more durable and enables use of higher temperature liquids without damage to breakable components of the bath.

The invention, together with further aspects and advantages thereof, may be further understood by reference to the following description of the preferred embodiment and by reference to the accompanying drawings.

BRIEF DESCRIPTION OF THE DRAWINGS

FIG. 1 is a perspective view of a high temperature recirculating chemical bath embodying the invention.

FIG. 2 is a cross section view of the chemical bath taken along line 2—2 of FIG. 1.

FIG. 3 is a partially broken out side elevation view of the chemical bath of FIG. 1 with certain components of the liquid recirculation system being shown in schematic form.

FIG. 4 is a top view of the apparatus of the preceding figures.

FIG. 5 is an enlarged cross sectional view of the portion of the apparatus encircled by dashed line 5 in FIG. 2.

DETAILED DESCRIPTION OF THE PREFERRED EMBODIMENT

Referring initially to FIG. 1 of the drawings, components of a recirculating chemical bath 11 embodying the invention include an external housing or casing 12 and a liquid chemical receptacle 13 which is supported by the casing. Receptacle 13 has a first compartment which functions as a processing vessel 14 for receiving articles 16 that are to be treated in the chemical bath 11 and an adjacent second compartment which is a sump 17 for containing liquid chemical that overflows from the processing vessel. The overflow is received and carried to the sump 17 by an inclined trough 18 which extends across one end of the processing vessel, along both sides of the processing vessel and along both sides of the sump 17 at the opposite end of the processing vessel.

Referring to FIGS. 2, 3 and 4 in conjunction, the casing 12 and receptacle 13 have a generally rectangular shape in this embodiment of the invention although other configurations are also possible. Casing 12 forms a rectangular chamber 19 in which the lower and intermediate regions of the receptacle 13 are received and seated. The upper portions of receptacle 13 extend above casing 12 and the trough 18 is situated above the rim 21 of the casing and is spaced apart from the casing rim in the vertical direction to isolate the trough from the rim.

The receptacle 13, including processing vessel 14, sump 17 and trough 18, is preferably an integral body of refractory material of a type that is chemically non-reactive with the liquids that are used in the bath. The receptacle 13 may, for example, be formed by fusing quartz plates together in instances where the bath 11 is to be used for processing integrated circuit wafers 16. Casing 12 is formed of a different material that is less brittle and which can be more easily fabricated into the desired shape, polypropylene plastic being a suitable example.

The interior chamber 19 of casing 12 is somewhat broader and longer than receptacle 13 to provide space between the receptacle and the chamber walls 22 in which thermal insulation 23 is disposed. The liquid chemical 24 within the bath 11 is heated by a series of band-like electrical heating elements 26 of the resistive type which are disposed against the bottom and the lower portions of the outer walls 27 of the processing vessel 14 region of receptacle 13.

Casing 12 has a support leg 28 at each lower corner of the casing to provide space beneath the receptacle 13 for a flow outlet fitting 29 and flow inlet fitting 31 which are secured to the underside of the casing by mounting brackets 32. Outlet fitting 29 is communicated with an opening 33 at the bottom of sump 17 through a pipe 34 and inlet fitting 31 communicates with an opening 36 at the center of the base of processing vessel 14 through another pipe 37.

A pump 38 draws liquid chemical from the sump 17 through fitting 29 and pipe 34, directs the liquid through a filter 39 and recirculates the filtered liquid back into processing vessel 14 through fitting 31 and pipe 37. Thus a continuous flow of heated liquid chemical 24 travels upward within processing vessel 14 and then overflows into trough 18 which carries the overflow back to the sump 17. The upper edge 41 of processing vessel 14 is scalloped in this embodiment to assure an even distribution of the overflow around the perimeter of the processing vessel. This acts to equalize the flow rate past articles 16 that are located at different regions of the processing vessel 14. The volume of liquid chemical in the bath 11 is such that the sump 17 is only partially filled prior to immersion of the wafers or other articles 16 in the processing vessel 14. Thus, with reference again to FIG. 1, the sump 17 is able to contain the liquid that is displaced from processing vessel 14 as the articles 16 and article carrier 40 are being immersed. Liquid level in processing vessel 14 temporarily drops and overflow temporarily ceases when a batch of articles 16 is removed from the bath 11. The sump 17 also serves to avoid pump starvation during such periods.

Referring to FIG. 5, the rim 21 of casing 12 is defined by a rim member 42 which extends around the perimeter of the casing at the top of the casing wall 22. Rim member 42 has a flange like base portion 44 which straddles the top of the casing wall 43 and which extends a short distance outward from the wall to assure that the receptacle 13 is not impacted against nearby structural walls or equipment. Another portion 46 of rim member 42 extends a short distance downward from base portion 44 at a location which is just inside the casing wall 43. Still another portion 47 extends upward from the base portion 44 at a location above portion 46.

Receptacle 13 is secured to the casing 12 though a flange 48 which extends outward from the receptacle and which overlays the top of portion 47 of casing rim member 42, a corrugated spacer 51 being disposed between the flange and portion 47 to provide cushioning at the juncture of the flange and rim member. Flange 48 extends outwardly a small distance beyond portion 47 of the rim member 42 and has a downwardly directed lip 52 at the outer edge forming a pocket 53 in which sealing mastic 54 is disposed and bonded to both the flange 48 and the rim member to prevent entry of liquid and vapors into the casing 12. The mastic 54 extends into a horizontal groove 55 in rim member portion 47 to mechanically lock the mastic in place. Another volume 56 of the sealing mastic extends between rim member portion 47 and receptacle 13 and is adhered to portion 47, the receptacle wall and the underside of flange 48.

Flange 48 is an integrated portion of the receptacle 13 and is formed of the same refractory material such as quartz. As such materials tend to be relatively brittle and breakable, it is desirable to isolate the receptacle 13 including flange 48 from stresses that might otherwise be exerted on the receptacle by flexing of the plastic material of casing 12. For this purpose, the rim member is secured to the top of casing wall 43 by a triple bead plastic weld 57. Weld 57 includes an inner bead 58 at the outer juncture of flange 48 and rim member 42, a second bead 59 bonded to bead 58 and the underside of flange 48 and a third bead 61 bonded to the inner bead 58 and rim member portion 47. The second and third beads 59 and 61 are slightly separated from each other.

As the plastic material of which the weld 57 is formed is slightly flexible when in the above described configuration, the weld acts as a hinge enabling a small degree of rocking motion of rim member 42 relative to casing wall 43. This enables the rim member 42 to accommodate to flexing of the casing wall 43 without stressing of the quartz flange 48.

As previously discussed, the seal formed by mastic 54 and 56 bonds components, rim member 42 and flange 48, formed of different materials that exhibit different degrees of thermal expansion upon being heated and the mastic itself may have still another coefficient of thermal expansion. Repeated differential expansion of the three materials in response to very high heat inputs causes a mechanical working of the polymerized mastic 54, 56 that can lead to early failure of the sealing mastic both in the integrity of its body and in its adhesion to the adjacent quartz and plastic materials. Heat input to the components which form the casing seal 62 is minimized, thereby lengthening the life of the seal, by the flange 48 which is vertically spaced apart from the underside of trough 18. Heat is not directly transferred from hot liquid in trough 18 to the mastic 54, 56 through the floor of the trough as in the above described prior construction of chemical baths of this general type. In addition, cooling air may circulate in the region 63 immediately above the quartz flange 48 and remove heat which is conducted to the seal 62 from the processing vessel 14. In further contrast to the prior construction, trough 18 is not subjected to potentially damaging mechanical stress caused by differential expansion of components of the seal 62.

The chemical bath 11 has been herein described with reference to the processing of batches of integrated circuit wafers 16. The bath construction is adaptable to processing of diverse other products which need to be immersed in a heated liquid for etching, cleaning or for other purposes and to operations where articles may be continuously fed into and removed from the bath by a conveyor or the like.

While the invention has been described with respect to a single preferred embodiment for purposes of example, many variations and modifications of the bath construction are possible within the scope of the invention and it is not intended to limit the invention except as defined in the following claims.

I claim:

1. A recirculating chemical bath for immersing articles in a flow of hot liquid chemical comprising:

a casing having a chamber therein and having a rim which extends around the perimeter of said chamber at the upper end thereof, a liquid chemical receptacle having a lower region situated within said chamber and an upper region which extends above said rim thereof, said receptacle having a first compartment forming a processing vessel for receiving said articles and a second compartment forming a sump for containing liquid chemical which overflows from said processing vessel and having a trough which extends along said processing vessel in position to receive said overflow therefrom and to carry said overflow to said sump, said trough being at a location on said receptacle that is above said casing rim and vertically spaced apart therefrom, said receptacle further having an outwardly extending flange overlying said casing rim which flange is below said trough and vertically spaced apart therefrom, sealing material disposed at the underside of said flange and contacting both said underside of said flange and said casing rim, and means for heating said liquid chemical and means for recirculating said liquid chemical from said sump back to said processing vessel.

2. The recirculating chemical bath of claim 1 wherein said receptacle including said processing vessel and said sump and said trough is a unitary body of refractory material and wherein said flange is a unitary portion of said body of refractory material.

3. The recirculating chemical bath of claim 1 wherein said flange is an integral portion of said receptacle and is formed of quartz.

4. The recirculating chemical bath of claim 1 wherein said receptacle including said flange is formed of refractory material and wherein said casing including said rim of said chamber thereof is formed of a different and less bittle material.

5. The recirculating chemical bath of claim 1 wherein said casing has upwardly extending sidewalls and wherein said rim of said said casing is formed by a flanged rim member which extends around said perimeter of said casing chamber at the top of said sidewall and which is secured thereto, said rim member being bonded to said underside of said flange by said sealing material.

6. The recirculating chemical bath of claim 5 wherein said flange has a downwardly directed lip at the outer edge of the flange forming an inverted pocket at said underside of said flange and wherein an upwardly directed portion of said rim member extends into said pocket, said sealing material being disposed in said pocket at each side of said upwardly directed portion of said rim member.

7. The recirculating chemical bath of claim 1 wherein said trough has a floor which extends outwardly on said receptacle and an outer wall which extends upward from the outer edge of said floor, and wherein said flange extends outwardly on said receptacle at a location directly beneath said floor of said flange.

8. The recirculating chemical bath of claim 1 wherein said flange and said sealing material are continuous and extend completely around said receptacle.

9. The recirculating bath of claim 8 wherein the region between said floor of said trough and said flange is open to air circulation.

10. A recirculating chemical bath for immersing articles in a flow of hot liquid chemical comprising:

a casing having a chamber therein and having a rim member extending around the perimeter of said chamber at the upper end thereof, a liquid chemical receptacle having a processing vessel region for receiving said liquid chemical and said articles, a sump region for receiving liquid chemical which overflows from said processing vessel region, a trough extending along one end and opposite sides of said processing vessel and along opposite sides of said sump region in position to carry said overflow into said sump region, said trough being above said said rim member of said casing and being vertically spaced therefrom, and a flange which extends around said processing vessel region and sump region and which extends outward therefrom over said casing rim member, said flange being at a location that is below said trough and vertically spaced apart therefrom, said receptacle including said trough and said flange being a unitized body of refractory material, sealing material extending between the underside of said flange and said casing rim member and being bonded to each thereof, heating means for heating said liquid chemical within said processing region and pumping and filtering means for recirculating a flow of filtered liquid chemical from said sump region back to said processing region.

* * * * *